US008624355B2

(12) United States Patent
 Shirai

(10) Patent No.: US 8,624,355 B2
(45) Date of Patent: Jan. 7, 2014

(54) SEMICONDUCTOR DEVICE AND METHOD FOR MANUFACTURING THE SAME

(75) Inventor: Koji Shirai, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/526,118

(22) Filed: Jun. 18, 2012

(65) Prior Publication Data

US 2013/0187256 A1  Jul. 25, 2013

(51) Int. Cl.
 *H01L 29/72* (2006.01)
(52) U.S. Cl.
 USPC ........... 257/592; 257/558; 257/554; 257/556; 257/E27.022; 257/E27.037; 257/E27.038; 257/E27.039
(58) Field of Classification Search
 USPC ........... 257/E27.022, E27.038, E27.039, 585, 257/552, 558, 554, 556, 5
 See application file for complete search history.

(56) References Cited

U.S. PATENT DOCUMENTS

| 3,483,446 | A | * | 12/1969 | Van Der Leest | 257/552 |
| 4,283,236 | A | * | 8/1981 | Sirsi | 438/335 |
| 5,016,075 | A | * | 5/1991 | Minato | 257/556 |
| 5,163,178 | A | * | 11/1992 | Gomi et al. | 257/558 |
| 5,237,200 | A | * | 8/1993 | Nanba et al. | 257/653 |
| 5,777,375 | A | * | 7/1998 | Shishido | 257/550 |
| 5,828,124 | A | * | 10/1998 | Villa | 257/557 |
| 6,501,152 | B1 | * | 12/2002 | Johnson | 257/558 |
| 8,115,280 | B2 | * | 2/2012 | Chen et al. | 257/593 |

FOREIGN PATENT DOCUMENTS

JP         05-021442         1/1993

* cited by examiner

*Primary Examiner* — Michael Shingleton
(74) *Attorney, Agent, or Firm* — Patterson & Sheridan, LLP

(57) ABSTRACT

A semiconductor device includes an n-type first guard ring layer provided between an emitter layer and a collector layer on a surface side of a base layer, and having a higher n-type impurity concentration than the base layer, and an n-type second guard ring layer provided between the first guard ring layer and a buried layer, connected to the first guard ring layer and the buried layer, and having a higher n-type impurity concentration than the base layer. The first guard ring layer has an n-type impurity concentration profile decreasing toward the second guard ring layer side, and the second guard ring layer has an impurity concentration profile decreasing toward the first guard ring layer side.

10 Claims, 5 Drawing Sheets

SEMICONDUCTOR DEVICE AND METHOD FOR MANUFACTURING THE SAME

CROSS-REFERENCE TO RELATED APPLICATIONS

This application is based upon and claims the benefit of priority from the prior Japanese Patent Application No. 2012-011470, filed on Jan. 23, 2012; the entire contents of which are incorporated herein by reference.

FIELD

Embodiments described herein relate generally to a semiconductor device and a method for manufacturing the same.

BACKGROUND

In the lateral PNP transistor, the amplification factor ($h_{FE}$) tends to increase with downsizing. However, the amplification factor higher than necessary may cause the problem of e.g. being prone to oscillation.

DETAILED DESCRIPTION

Figure 1A:
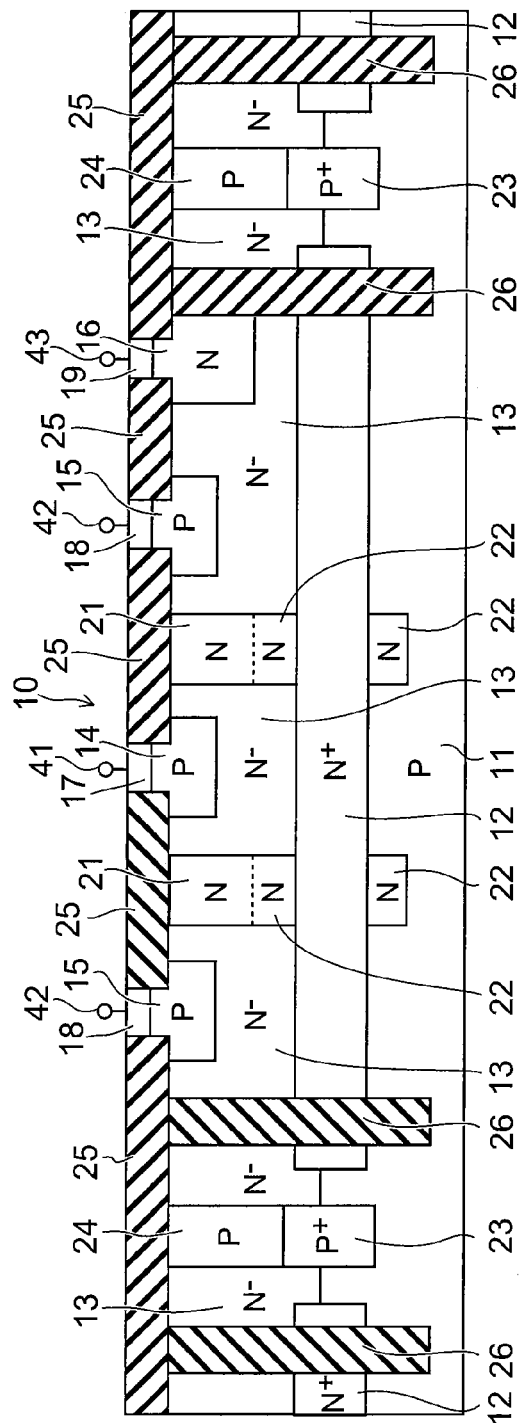
FIG. 1A is a schematic sectional view of a semiconductor device of an embodiment.

According to one embodiment, a semiconductor device includes a substrate, an n-type buried layer, an n-type base layer, a p-type emitter layer, a p-type collector layer, an n-type first guard ring layer, and an n-type second guard ring layer. The n-type buried layer is provided on the substrate. The n-type base layer is provided on the buried layer and has an n-type impurity concentration lower than an n-type impurity concentration of the buried layer. The p-type emitter layer is provided in a surface of the base layer. The p-type collector layer is provided in the surface of the base layer and spaced from the emitter layer. The n-type first guard ring layer is provided between the emitter layer and the collector layer on a surface side of the base layer, spaced from the emitter layer and the collector layer, and has an n-type impurity concentration higher than an n-type impurity concentration of the base layer. The n-type second guard ring layer is provided between the first guard ring layer and the buried layer, connected to the first guard ring layer and the buried layer, and has an n-type impurity concentration higher than the n-type impurity concentration of the base layer. The first guard ring layer has an n-type impurity concentration profile decreasing toward the second guard ring layer side, and the second guard ring layer has an impurity concentration profile decreasing toward the first guard ring layer side.

Various embodiments will be described hereinafter with reference to the accompanying drawings. In the drawings, like components are labeled with like reference numerals.

In the following embodiments, silicon is taken as an example of the material of the semiconductor layer and substrate. However, semiconductors other than silicon (e.g., compound semiconductors such as SiC and GaN) can also be used.

The semiconductor device of the embodiment includes an integrated circuit (e.g., analog integrated circuit) in which a lateral PNP bipolar transistor (hereinafter also simply referred to as PNP transistor) and other components such as transistors and diodes are provided and integrated on the same substrate.

Figure 1B:
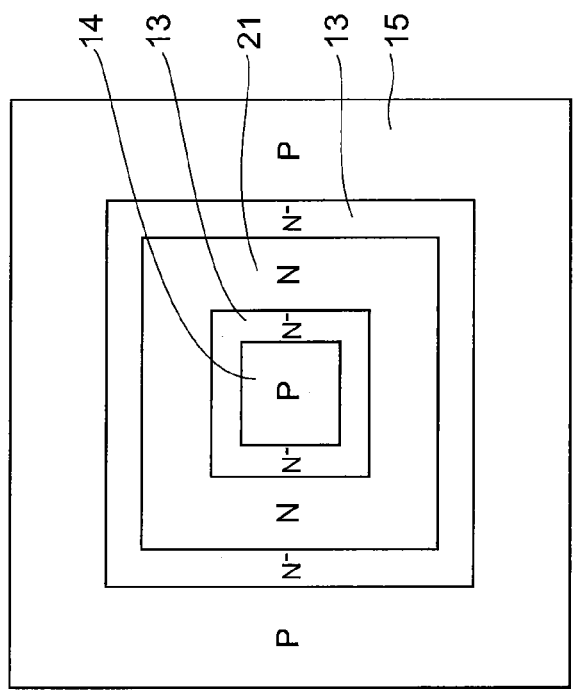
FIG. 1B is a schematic plan view of major components of the semiconductor device of the embodiment.

FIG. 1A is a schematic sectional view of a portion where a PNP transistor 10 is formed. FIG. 1B is a schematic plan view showing the planar layout of major components in the PNP transistor 10.

The substrate 11 can be e.g. a p-type silicon substrate. On the substrate 11, an n-type base layer 13 is provided. In the device region with the PNP transistor 10 formed therein, between the substrate 11 and the base layer 13, an n-type buried layer 12 is provided in contact with the substrate 11 and the base layer 13.

The n-type impurity concentration of the buried layer 12 is higher than the n-type impurity concentration of the base layer 13. The buried layer 12 functions as part of the base in the PNP transistor 10. By the buried layer 12, the PNP transistor 10 is electrically isolated from the substrate 11.

In the surface of the base layer 13, a p-type emitter layer 14 and a p-type collector layer 15 are provided and spaced from each other. FIG. 1B illustrates a planar layout in which the collector layer 15 continuously surrounds the periphery of the emitter layer 14. However, the planar layout is not limited thereto.

On the surface of the emitter layer 14 is provided a p-type emitter contact layer 17 having a higher p-type impurity concentration than the emitter layer 14. To the emitter contact layer 17, an emitter electrode 41 is ohmically connected.

On the surface of the collector layer 15 is provided a p-type collector contact layer 18 having a higher p-type impurity concentration than the collector layer 15. To the collector contact layer 18, a collector electrode 42 is ohmically connected.

In the surface of the base layer 13 outside the region where the collector layer 15 surrounds the emitter layer 14, an n-type base contact layer 16 having a higher n-type impurity concentration than the base layer 13 is provided. Furthermore, on the surface of the base contact layer 16 is provided an n-type base contact layer 19 having a higher n-type impurity concentration than the base contact layer 16. To the base contact layer 19, a base electrode 43 is ohmically connected.

A device isolation layer 25 is provided on the surface of the base layer 13 between the emitter contact layer 17 and the collector contact layer 18, and on the surface of the base layer 13 between the collector contact layer 18 and the base contact layer 19. The device isolation layer 25 has a structure in which e.g. an insulating film such as silicon oxide film is provided in a trench.

Furthermore, the device isolation layer 25 is provided also on the surface of the base layer 13 outside the region provided with the PNP transistor 10.

On the surface side of the base layer 13 between the emitter layer 14 and the collector layer 15, an n-type first guard ring layer 21 is provided. The first guard ring layer 21 is not in contact with the emitter layer 14 and the collector layer 15, but spaced from the emitter layer 14 and the collector layer 15. The upper portion of the first guard ring layer 21 reaches the device isolation layer 25.

Below the first guard ring layer 21, an n-type second guard ring layer 22 is provided. The second guard ring layer 22 extends in the thickness direction of the base layer 13. The upper side of the second guard ring layer 22 is connected to the first guard ring layer 21. The lower side of the second guard ring layer 22 is connected to the buried layer 12.

The n-type impurity concentration of the first guard ring layer 21 and the n-type impurity concentration of the second guard ring layer 22 are higher than the n-type impurity concentration of the base layer 13.

Figure 2:
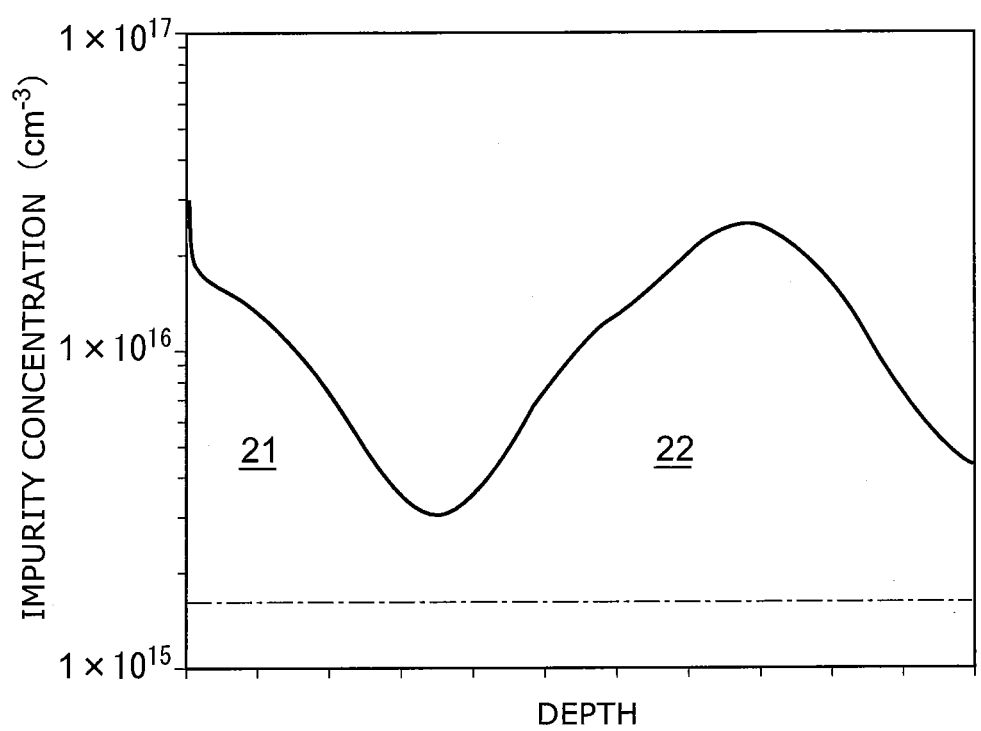
FIG. 2 is a view showing an impurity concentration profile in a depth direction of a guard ring layer of the semiconductor device of the embodiment.

FIG. 2 shows an n-type impurity concentration profile in the depth direction of the first guard ring layer 21 and the second guard ring layer 22 by a solid line. The horizontal axis represents the depth direction of the first guard ring layer 21 and the second guard ring layer 22 (thickness direction of the base layer 13). The vertical axis represents the n-type impurity concentration ($cm^{-3}$).

The first guard ring layer 21 has an n-type impurity concentration profile decreasing toward the second guard ring layer 22 side. The second guard ring layer 22 has an n-type impurity concentration profile decreasing toward the first guard ring layer 21 side.

As described later, the first guard ring layer 21 is formed by implanting n-type impurity by the ion implantation process and thermally diffusing the implanted n-type impurity. The first guard ring layer 21 has a peak of impurity concentration in the vicinity of the implantation position of n-type impurity. From the peak position toward the second guard ring layer 22 side, the n-type impurity concentration decreases.

Likewise, as described later, the second guard ring layer 22 is formed by implanting n-type impurity by the ion implantation process and thermally diffusing the implanted n-type impurity. The second guard ring layer 22 has a peak of impurity concentration in the vicinity of the implantation position of n-type impurity. From the peak position toward the first guard ring layer 21 side, the n-type impurity concentration decreases.

That is, the first guard ring layer 21 and the second guard ring layer 22 are connected as an n-type region having a higher impurity concentration than the base layer 13 by thermal diffusion of n-type impurity. In the vicinity of the connected portion (the boundary between the first guard ring layer 21 and the second guard ring layer 22), the n-type impurity concentration has a local minimum.

The n-type impurity concentration of the base layer 13 is nearly constant in its thickness direction. For instance, as indicated by a dot-dashed line in FIG. 2, the n-type impurity concentration of the base layer 13 is approximately $1.5 \times 10^{15}$ $cm^{-3}$. The minimum of the n-type impurity concentration of the first guard ring layer 21 and the minimum of the n-type impurity concentration of the second guard ring layer 22 are higher than the n-type impurity concentration of the base layer 13.

The n-type impurity concentration of the buried layer 12 is e.g. approximately $10^{18}$ $cm^{-3}$. The maximum of the n-type impurity concentration of the first guard ring layer 21 and the maximum of the n-type impurity concentration of the second guard ring layer 22 are lower than the maximum of the n-type impurity concentration of the buried layer 12.

As shown in FIG. 1B, the first guard ring layer 21 continuously surrounds the periphery of the emitter layer 14. The second guard ring layer 22 has nearly the same width as the first guard ring layer 21 and is provided below the first guard ring layer 21. The second guard ring layer 22 continuously surrounds the region of the base layer 13 below the emitter layer 14.

That is, the periphery and lower side of the emitter layer 14 are surrounded with the first guard ring layer 21, the second guard ring layer 22, and the buried layer 12, which have a higher n-type impurity concentration and a higher density of electrons to be recombined with holes than the base layer 13.

Outside the region provided with the PNP transistor 10, a device isolation layer 26 is provided. The device isolation layer 26 has e.g. a deep trench isolation (DTI) structure. In this structure, an insulating film such as silicon oxide film is buried in a trench penetrating from the surface device isolation layer 25 through the base layer 13 and the buried layer 12 to the substrate 11.

Further outside the device isolation layer 26, a diffusion type device isolation layer including a p-type buried layer 23 and a p-type device isolation layer 24 is provided.

The p-type buried layer 23 is spaced from the n-type buried layer 12 and provided at nearly the same depth as the n-type buried layer 12. The p-type device isolation layer 24 has a lower p-type impurity concentration than the p-type buried layer 23. The p-type device isolation layer 24 is provided above the p-type buried layer 23 and extends to the surface device isolation layer 25.

The device isolation layer 26 of the DTI structure continuously surrounds the periphery of the region provided with the PNP transistor 10. Outside the device isolation layer 26 of the DTI structure, the diffusion type device isolation layer continuously surrounds the periphery of the region provided with the PNP transistor 10. The PNP transistor 10 is isolated from other components formed on the same substrate 11 by the device isolation layer 26 and the diffusion type device isolation layer.

In the PNP transistor 10 described above, to the PN junction of the emitter layer 14 and the base layer 13 is applied a forward voltage. Thus, majority carriers (holes) in the emitter layer 14 are injected into the base layer 13. To the PN junction of the collector layer 15 and the base layer 13 is applied a reverse voltage. Thus, the holes injected into the base layer 13 and not eliminated in the base layer 13 flow to the collector layer 15.

Downsizing of the lateral PNP transistor 10 results in decreasing the distance between the emitter layer 14 and the collector layer 15. Thus, the amplification factor ($h_{FE}$) tends to increase. The amplification factor higher than necessary may cause the problem of e.g. oscillation.

However, according to the embodiment, in the base layer 13, in the portion between the emitter layer 14 and the collector layer 15 and in the portion therebelow, a first guard ring layer 21 and a second guard ring layer 22 having a higher n-type impurity concentration than the base layer 13 are provided. The first guard ring layer 21 reaches the device isolation layer 25. The second guard ring layer 22 reaches the buried layer 12.

Hence, migration of the holes, which have been injected from the emitter layer 14 into the base layer 13, to the collector layer 15 side is limited by the first guard ring layer 21 and the second guard ring layer 22. Thus, the device size (the distance between the emitter layer 14 and the collector layer 15) can be reduced while suppressing the increase of the amplification factor. The PNP transistor according to the embodiment can reduce the device size, and is suitable for integration with other devices.

By reduction of the device size, the distance between the emitter layer 14 and the collector layer 15 is shortened. This causes concern about punch-through and leakage. In punch-through, the depletion layer extended from the emitter layer 14 side and the depletion layer extended from the collector layer 15 side are connected. However, the first guard ring layer 21 and the second guard ring layer 22 of the embodiment can prevent the above punch-through.

Figure 5A:
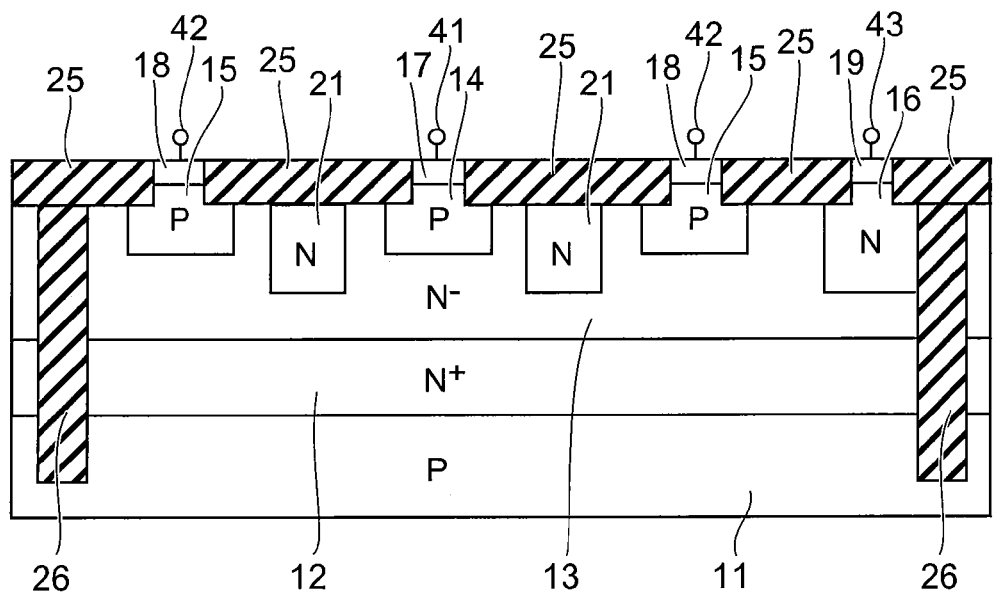
FIGS. 5A and 5B are schematic sectional views of a semiconductor device of a comparative example.
Figure 5B:
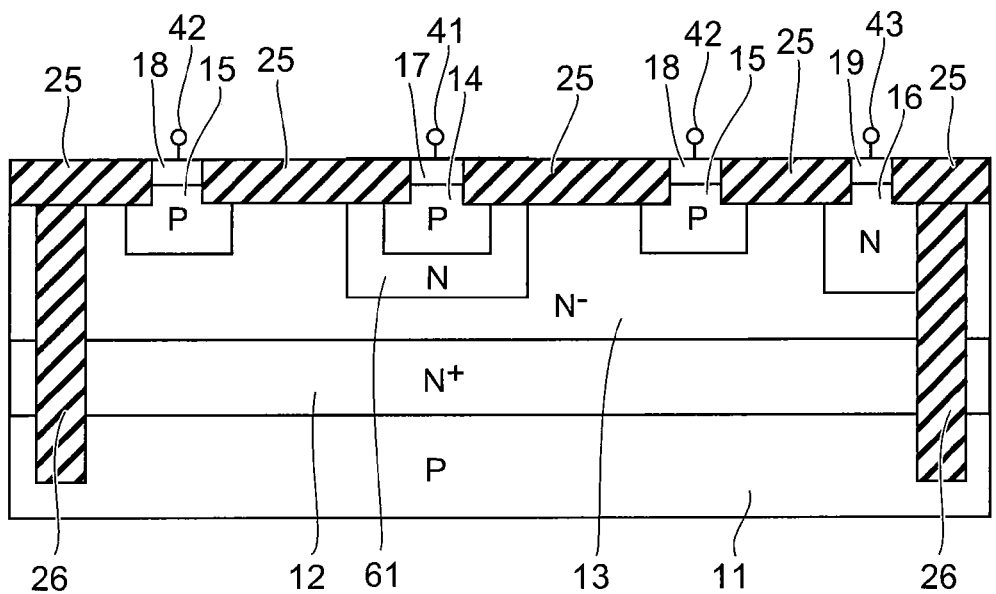

Here, FIG. 5B shows a first comparative example. In the structure of the first comparative example, for instance, a p-type emitter layer 14 is provided in an n-type well layer 61 having a higher n-type impurity concentration than the base layer 13 and limiting the hole current.

However, in this first comparative example, the p-type emitter layer 14 and the n-type well layer 61 having a relatively high impurity concentration are in contact with each other. Thus, the emitter-base breakdown voltage is likely to decrease.

In contrast, according to the embodiment, the n-type first guard ring layer 21 and the n-type second guard ring layer 22 for limiting the hole current are spaced from the p-type emitter layer 14, and not in contact therewith. This can suppress the decrease of the emitter-base breakdown voltage, and achieve an emitter-base breakdown voltage comparable to the emitter-collector breakdown voltage.

As shown in FIG. 2, in the vicinity of the connected portion of the first guard ring layer 21 and the second guard ring layer 22 (the boundary between the first guard ring layer 21 and the second guard ring layer 22), the n-type impurity concentration is made relatively lower than the other portion.

Hence, the holes injected from the emitter layer 14 into the base layer 13 pass primarily through the vicinity of the boundary between the first guard ring layer 21 and the second guard ring layer 22 and flow to the collector layer 15. Hence, the amplification factor can be controlled by controlling the n-type impurity concentration in the vicinity of the boundary between the first guard ring layer 21 and the second guard ring layer 22.

The integrated circuit including the PNP transistor 10 of the embodiment can be used as e.g. a battery monitoring IC. Then, the PNP transistor 10 is required to have a breakdown voltage of 50 V or more. For instance, the breakdown voltage of the PNP transistor 10 of the embodiment is approximately 80-100 V. Thus, the thickness of the base layer 13 is designed to be 5 μm or more (such as 6 μm).

In the base layer 13 having a thickness of 5 μm or more, n-type impurity is injected and thermally diffused on the surface side of the base layer 13. However, a high concentration n-type region having an n-type impurity concentration of approximately $10^{16}$ cm$^{-3}$, higher than that of the base layer 13, is difficult to form throughout the thickness of the base layer 13.

FIG. 5A shows a second comparative example. In the second comparative example, the guard ring layer 21 does not reach the buried layer 12. This allows holes to flow through the base layer 13 between the guard ring layer 21 and the buried layer 12.

In contrast, according to the embodiment, as described below, the first guard ring layer 21 and the second guard ring layer 22 are formed as an integrated n-type semiconductor layer connected in the thickness direction of the base layer 13 by thermal diffusion of n-type impurity implanted to different depths by the ion implantation process.

Figure 3A:
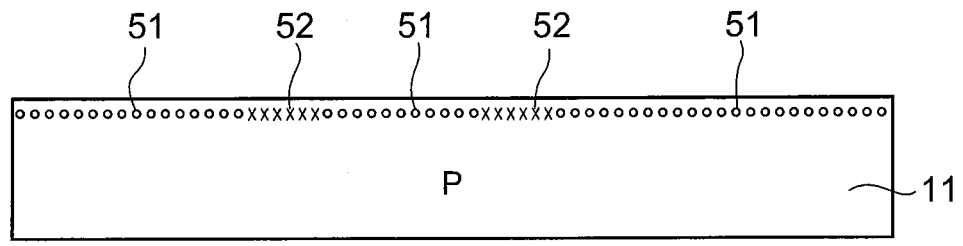
FIGS. 3A to 3C are schematic sectional views showing a method for manufacturing the semiconductor device of the embodiment.
Figure 3B:
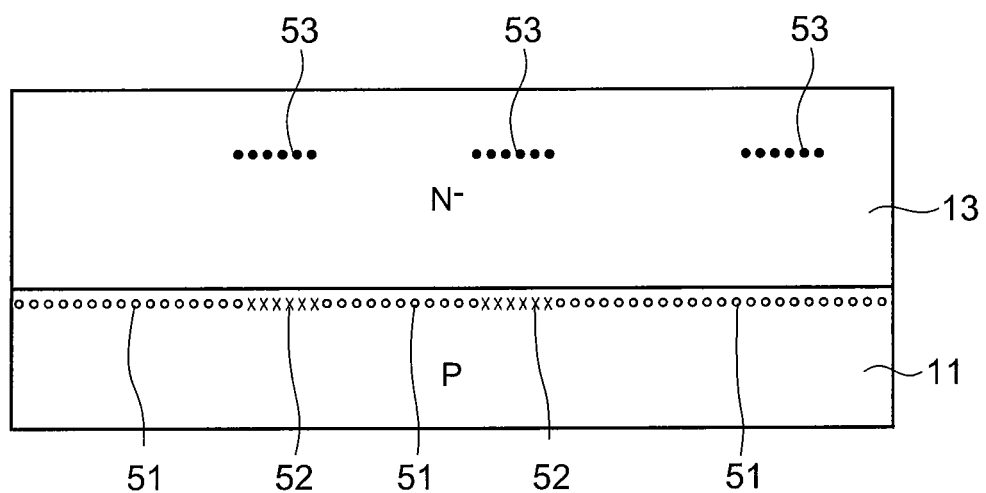
Figure 3C:
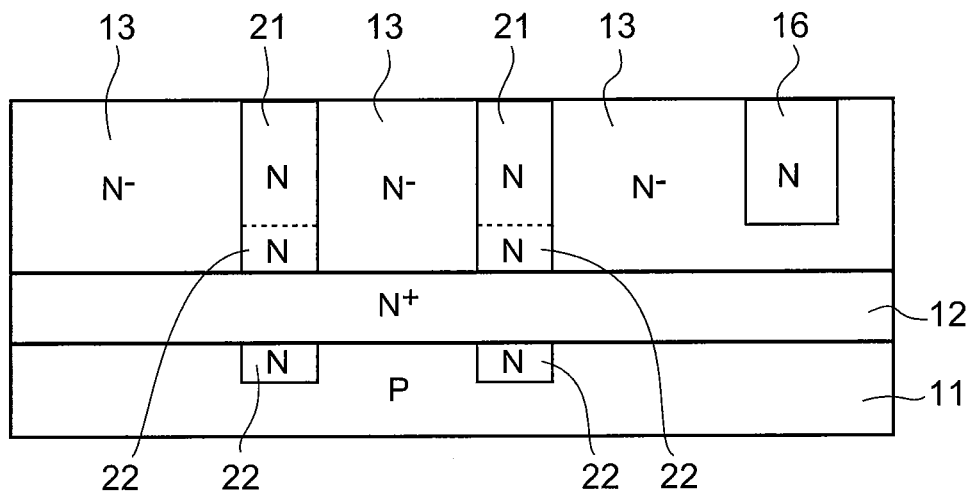

FIGS. 3A to 3C are schematic sectional views for describing a method for manufacturing the PNP transistor 10.

First, as shown in FIG. 3A, on the surface side of the substrate 11, a first n-type impurity 51 schematically indicated by open circles and a second n-type impurity 52 schematically indicated by cross marks are implanted by the ion implantation process. The first n-type impurity 51 is implanted into a region for forming the aforementioned n-type buried layer 12. The second n-type impurity 52 is implanted into a region for forming the aforementioned second guard ring layer 22. This region is smaller than the implantation region of the first n-type impurity 51.

The first n-type impurity 51 is e.g. antimony. The second n-type impurity 52 is e.g. phosphorus, having a faster diffusion rate than the first n-type impurity 51.

After ion implantation of the first n-type impurity 51 and the second n-type impurity 52, as shown in FIG. 3B, an n-type base layer 13 is formed on the substrate 11 by e.g. the epitaxial growth process.

Then, in the base layer 13 above the implantation position of the second n-type impurity 52, a third n-type impurity 53 schematically indicated by filled circles are ion implanted. The third n-type impurity 53 can be the same as the second n-type impurity 52, such as phosphorus.

Then, by annealing, the first n-type impurity 51, the second n-type impurity 52, and the third n-type impurity 53 are simultaneously subjected to thermal diffusion.

By the thermal diffusion of the first n-type impurity 51, as shown in FIG. 3C, an n-type buried layer 12 is formed in the vicinity of the boundary between the substrate 11 and the base layer 13.

The second n-type impurity 52 and the third n-type impurity 53 are each diffused in the thickness direction of the base layer 13, and connected in the thickness direction of the base layer 13 as a first guard ring layer 21 and a second guard ring layer 22.

The second n-type impurity 52 and the first n-type impurity 51 are implanted to the same depth in the substrate 11. However, the second n-type impurity 52 has a faster diffusion rate than the first n-type impurity 51. Hence, the second n-type impurity 52 extends and diffuses further than the first n-type impurity 51 in the thickness direction of the base layer 13 (the thickness direction of the substrate 11). Thus, the diffused region of the second n-type impurity 52 is connected to the region of the third n-type impurity 53 diffused downward.

Here, the second n-type impurity 52 diffuses below the buried layer 12. Part of the second guard ring layer 22 is projected also below the buried layer 12. Alternatively, depending on the implantation depth of the second n-type impurity 52 and the thickness of the buried layer 12, the second guard ring layer 22 may not be projected below the buried layer 12.

The second n-type impurity 52 is implanted on the surface side of the substrate 11 before forming the base layer 13. Thus, the second n-type impurity 52 does not need to be implanted into a deep position of the thick base layer 13. This facilitates the process.

The second n-type impurity 52 and the third n-type impurity 53 are not limited to phosphorus, but may be arsenic.

As described above, the embodiment can easily form an n-type guard ring layer having a higher n-type impurity concentration than the base layer 13 throughout the thickness of the base layer 13 even if e.g. a breakdown voltage of 50 V or more is required and the thickness of the base layer 13 is 5 μm or more.

Figure 4:
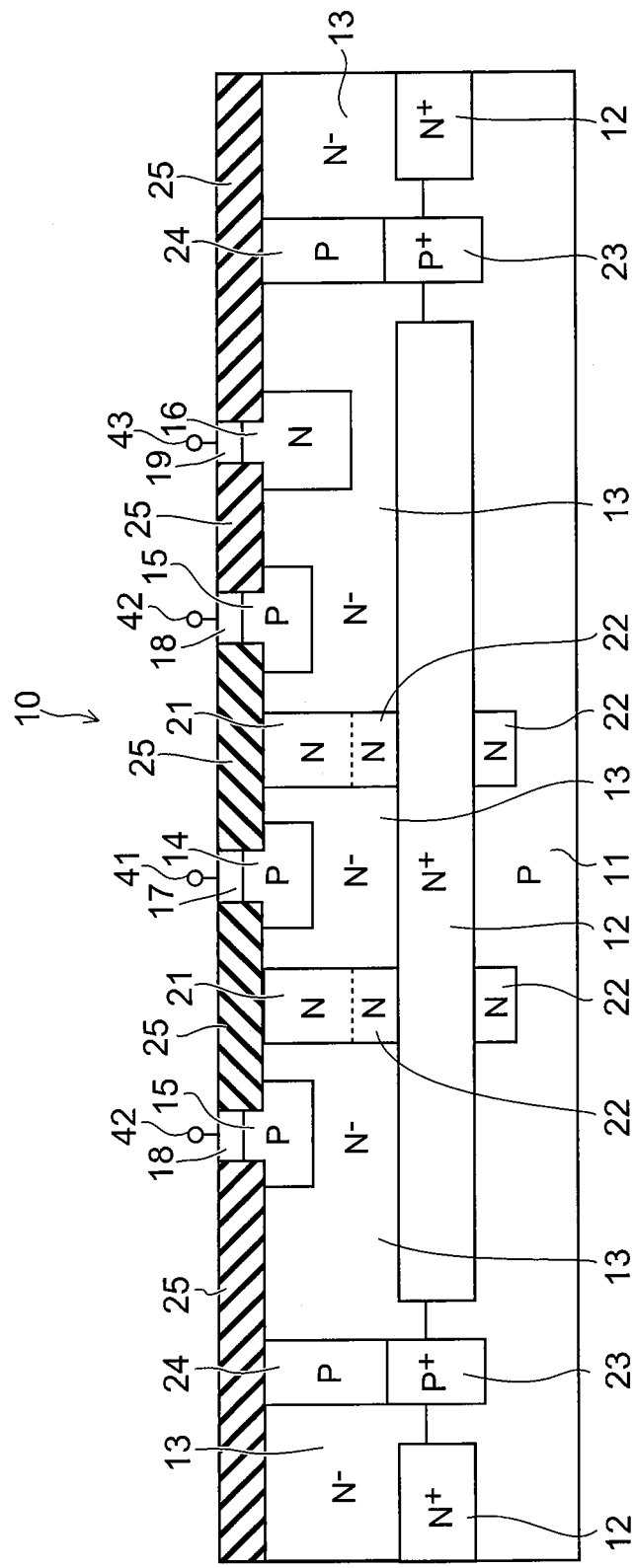
FIG. 4 is a schematic sectional view of a semiconductor device of another embodiment.

FIG. 4 is a schematic sectional view of a semiconductor device of an alternative embodiment.

In this embodiment, the device isolation layer of the DTI structure is not provided. By the diffusion type device isolation layer (n-type device isolation layer 24 and n-type buried layer 23), the PNP transistor 10 is isolated from other devices on the same substrate 11. Alternatively, without providing the diffusion type device isolation layer, device isolation may be performed only by the device isolation layer of the DTI structure.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device comprising:
    a substrate;
    an n-type buried layer provided on the substrate;
    an n-type base layer provided on the buried layer and having an n-type impurity concentration lower than an n-type impurity concentration of the buried layer;
    a p-type emitter layer provided in a surface of the base layer;
    a p-type collector layer provided in the surface of the base layer and spaced from the emitter layer;
    an n-type first guard ring layer provided between the emitter layer and the collector layer on a surface side of the base layer, spaced from the emitter layer and the collector layer, and having an n-type impurity concentration higher than an n-type impurity concentration of the base layer; and
    an n-type second guard ring layer provided between the first guard ring layer and the buried layer, connected to the first guard ring layer and the buried layer, and having an n-type impurity concentration higher than the n-type impurity concentration of the base layer,
    the first guard ring layer having an n-type impurity concentration profile decreasing toward the second guard ring layer side, and the second guard ring layer having an impurity concentration profile decreasing toward the first guard ring layer side.

2. The device according to claim 1, wherein the base layer has a thickness of 5 µm or more.

3. The device according to claim 1, wherein a maximum of the n-type impurity concentration of the first guard ring layer and a maximum of the n-type impurity concentration of the second guard ring layer are lower than a maximum of the n-type impurity concentration of the buried layer.

4. The device according to claim 1, wherein the first guard ring layer and the second guard ring layer continuously surround periphery of the emitter layer.

5. The device according to claim 1, wherein an n-type impurity included in the second guard ring layer and an n-type impurity included in the buried layer are different.

6. The device according to claim 5, wherein the second guard ring layer includes phosphorus or arsenic as the n-type impurity, and the buried layer includes antimony as the n-type impurity.

7. The device according to claim 1, wherein the buried layer is in contact with the substrate and the base layer.

8. The device according to claim 1, wherein the n-type impurity concentration profile in a direction connecting the first guard ring layer and the second guard ring layer has a local minimum in vicinity of a boundary between the first guard ring layer and the second guard ring.

9. The device according to claim 1, wherein a periphery and a lower side of the emitter layer are surrounded with the first guard ring layer, the second guard ring, and the buried layer.

10. The device according to claim 1, further comprising:
    a device isolation layer provided between the emitter layer and the collector layer on the surface side of the base layer,
    wherein an upper portion of the first guard ring layer reaches the device isolation layer.

* * * * *

UNITED STATES PATENT AND TRADEMARK OFFICE
CERTIFICATE OF CORRECTION

| | | |
|---|---|---|
| PATENT NO. | : 8,624,355 B2 | Page 1 of 1 |
| APPLICATION NO. | : 13/526118 | |
| DATED | : January 7, 2014 | |
| INVENTOR(S) | : Koji Shirai | |

It is certified that error appears in the above-identified patent and that said Letters Patent is hereby corrected as shown below:

On the Title Page, Item (30) Foreign Application Priority Data, please insert the following:

--January 23, 2012      (JP)......................2012-011470--

Signed and Sealed this
Twenty-ninth Day of July, 2014

Michelle K. Lee
*Deputy Director of the United States Patent and Trademark Office*